United States Patent [19]
Weiler et al.

[11] Patent Number: 5,644,167
[45] Date of Patent: Jul. 1, 1997

[54] INTEGRATED CIRCUIT PACKAGE ASSEMBLIES INCLUDING AN ELECTROSTATIC DISCHARGE INTERPOSER

[75] Inventors: Peter M. Weiler, Alpine, Utah; Jagdish G. Belani, Cupertino, Calif.

[73] Assignee: National Semiconductor Corporation, Santa Clara, Calif.

[21] Appl. No.: 609,644

[22] Filed: Mar. 1, 1996

[51] Int. Cl.$^6$ .......................... H01L 23/62; H01L 23/52; H01L 25/065

[52] U.S. Cl. .......................... 257/777; 257/676; 257/672; 257/203

[58] Field of Search .......................... 257/203, 320, 257/321, 322, 777, 672, 676, 355–360, 723

[56] References Cited

U.S. PATENT DOCUMENTS

| | | | |
|---|---|---|---|
| 5,173,766 | 12/1992 | Long et al. | 257/668 |
| 5,486,720 | 1/1996 | Kierse | 257/796 |
| 5,495,118 | 2/1996 | Kinoshita et al. | 257/355 |
| 5,545,909 | 8/1996 | Williams et al. | 257/360 |
| 5,545,912 | 8/1996 | Ristic et al. | 257/420 |

FOREIGN PATENT DOCUMENTS

| | | | |
|---|---|---|---|
| 0099056 | 3/1992 | Japan | 257/777 |
| 0162767 | 6/1992 | Japan | 257/777 |

*Primary Examiner*—Sara W. Crane
*Assistant Examiner*—Alexander Oscar Williams
*Attorney, Agent, or Firm*—Hickman Beyer & Weaver

[57] ABSTRACT

An integrated circuit package assembly incorporating an electrostatic discharge (ESD) interposer is disclosed. The assembly includes a semiconductor chip including a plurality of chip input/output terminals. The interposer is formed using a substrate which supports the chip and includes an arrangement having a plurality of integrally formed ESD protection circuits for providing ESD protection to predetermined ones of the chip input/output terminals.

19 Claims, 2 Drawing Sheets

INTEGRATED CIRCUIT PACKAGE ASSEMBLIES INCLUDING AN ELECTROSTATIC DISCHARGE INTERPOSER

BACKGROUND OF THE INVENTION

The present invention relates generally to an integrated circuit package assembly and more particularly to an assembly which includes an Electrostatic Discharge Interposer (hereinafter ESD Interposer) which protects an integrated circuit chip or other such component within the overall assembly from being damaged by ESD or other overvoltage producing conditions.

In the field of integrated circuits, certain architectures have become prominent in semiconductor chips as a result of advantages such as high component density which accompany their use. One such architecture is Metal Oxide Semiconductor (MOS) technology. As with most electronic devices, maximum voltage values to which a particular device may safely be subjected are specified by its manufacturer. MOS technology is no exception. Devices manufactured using MOS and similar technologies utilize a gate structure which includes an insulative thin film layer that is typically formed from silicon dioxide and which is easily damaged by overvoltage conditions. The voltage at which such a layer breaks down is determined by factors such as the dielectric breakdown voltage of the material from which the layer is formed and the actual thickness of the layer within the device. In an unprotected device, the thin film gate insulative layer may suffer from dielectric breakdown at potentials, for example, around 10 volts for a 0.35 micron process whereby the gate is shorted and the device is rendered inoperable.

Unfortunately, however, these devices may also be subjected to the unavoidable and naturally occurring phenomenon of electrostatic discharge (ESD) in many different applications. ESD can easily exceed many thousands of volts which, without protection, can overvoltage virtually any device which includes one or more thin film layers such as those described immediately above whereby to, for example, short the gate of the device and render the device inoperable. In an effort to reduce the problems posed by overvoltage in general and by ESD in particular in these devices, manufacturers have incorporated overvoltage protection on the integrated circuit chip itself, as will be described immediately hereinafter.

Attention is now directed to FIG. 1 which illustrates a prior art integrated circuit package assembly generally indicated by reference numeral 10. Assembly 10 includes a semiconductor die 12 supported on a die attach pad 14 of a lead frame 16. The latter also includes a plurality of electrically conductive lead frame leads 18. Die 12 includes a plurality of ESD protection circuits 20 which are integrally formed with the die. ESD protection circuits 20 are in electrical communication with an overall integrated circuit structure (not shown) which is also integrally formed with the die using standard integrated circuit (IC) techniques. For purposes of simplicity, the specific details of the structure of ESD protection circuits 20 is not illustrated and will not be described herein since such circuitry is well known in the art.

Continuing to refer to FIG. 1, a plurality of bonding wires 22 electrically interconnect lead frame leads 18 with respective ones of ESD protection circuits 20. The assembly is encapsulated using an overall plastic or other such suitable encapsulant material 24. Typically, bonding wires used in integrated circuit assemblies such as those illustrated herein are formed using gold. Hence, these wires are rather expensive. In addition, the bonding wires arguably comprise the most fragile component which makes up an overall IC package assembly. During encapsulation of the assembly, encapsulant material flows around the bonding wires, subjecting the latter to a phenomenon known as wire sweep. Manufacturing costs are increased proportionate to the length of the bonding wires since longer wires are more likely to short to one another or break as a result of wire sweep. For both of the foregoing reasons, it is highly advantageous to minimize the length of these bonding wires.

Still referring to FIG. 1, when an overvoltage condition is applied to one of leads 18 by, for example, an ESD, the voltage is passed to die 12 via one of bonding wires 22. Ideally, the respective ESD protection circuit 20 to which that bonding wire is connected will actively clamp that overvoltage condition in a manner which is well known in the art whereby to shunt the excess voltage to ground to protect the remaining sensitive circuitry of the die from almost certain damage.

While the above described arrangement, which incorporates ESD protection within the die, does provide sensitive elements of the circuitry of the die, such as thin film insulative layers, with protection from overvoltage produced by ESD, the manufacturing difficulties associated with producing this arrangement as well as the limitations of its operational capabilities have become of concern, as will be described immediately hereinafter.

In the manufacture of a typical integrated circuit chip or die, the amount of surface area of silicon which is presently devoted to ESD protection is already of concern. While there is a desire to provide ESD protection, manufacturers are also driven in the highly competitive electronic market place to improve the functionality of a chip while maintaining as small a overall device footprint as possible. Therefore, components such as individual transistors and diodes which are integrally formed within the overall structure of a representative device are produced with the smallest possible geometries so as to conserve the valuable silicon "real estate" of the chip, leaving room for still further components with resultant increases in functionality. Therefore, manufacturers are reluctant to devote still more space to ESD protection at the cost of reduced functionality or a larger device footprint. In fact, it is now estimated that in high component density devices which will incorporate a 0.35 micron fabrication process, the consumption of silicon by ESD structures will approach nearly 50 percent of the available silicon area. Moreover, improved functionality typically results in the need for additional input/output terminals on the chip itself. As the number of input/output terminals increases, still more valuable silicon area must be devoted to ESD protection since each terminal requires protection.

Another concern stems from the desire to provide a device with an adequate level of ESD protection. Typical devices, which are presently available, provide protection from ESD up to approximately 2000 volts which is, in fact, a relatively small discharge. More recently, this level has been seen as inadequate and, in some cases, semi-conductor consumers are demanding more protection. In view of the foregoing discussion, however, manufacturer's ability to provide a significant increase in ESD protection is very limited since, in order to increase protection, the size of the ESD circuitry on the chip must increase dramatically in direct competition with other equally vital component structures integrally formed with the chip.

The present invention resolves the foregoing concerns by providing a highly advantageous ESD Interposer within an overall integrated circuit package assembly which allows for a decrease in chip footprint without affecting chip functionality and further provides protection from ESD at levels well beyond 2000 volts. In one feature of the present invention, bonding wire length may be minimized whereby to reduce manufacturing costs and improve reliability.

SUMMARY OF THE INVENTION

As will be described in more detail hereinafter, there is disclosed herein an integrated circuit package assembly. The assembly, like the assembly of FIG. 1, includes a semiconductor chip including a plurality of chip input/output terminals. However, in accordance with the present invention, the assembly includes a substrate supporting the chip and an arrangement including a plurality of ESD protection means on the substrate for providing ESD protection to predetermined ones of the chip input/output terminals.

In one embodiment of the assembly, the arrangement includes means for electrically connecting each of the predetermined chip input/output terminals with respective ones of the ESD protection means and for providing electrical communication between each of the predetermined chip input/output terminals and components external to the integrated circuit package assembly such that at least one ESD protection means is electrically interposed between that chip input/output terminal and any external component with which the terminal is in electrical communication in a way which protects the chip from ESD.

In one preferred embodiment, the arrangement includes a plurality of output leads connected with respective ones of the ESD protection means and designed for electrical connection with external components and a plurality of bonding wires, each of which is directly connected at one end to a respective one of the input/output terminals and at its opposite end directly to a respective one of the ESD protection means wherein each ESD protection means is elongated in configuration and extends along its elongation axis on the substrate between a respective one of the input/output terminals and a corresponding respective output lead such that one end of each of the ESD protection means is closer to its respective input/output terminal than its other end, and wherein the opposite end of each of said bonding wires is connected to its respective ESD protection means at its one, closer end, whereby to minimize the length of the bonding wires.

In a second embodiment of the assembly, the substrate includes means for electrically connecting each of the predetermined chip input/output terminals with respective ones of the ESD protection means and the arrangement includes means for providing electrical communication between each of the ESD protection means and components external to the integrated circuit package assembly such that at least one of the ESD protection means is electrically interposed between each predetermined chip input/output terminal and any external component with which the terminal is in electrical communication in a way which protects the chip from ESD.

In one feature of the second embodiment, the electrical connecting means includes a plurality of electrically conductive traces integrally formed with the substrate, each respective one of the traces being in electrical contact with a respective predetermined chip input/output terminal and with a respective one of the ESD protection means.

BRIEF DESCRIPTION OF THE DRAWINGS

The present invention may be understood by reference to the following detailed description taken in conjunction with the drawings, in which.

DETAILED DESCRIPTION OF THE INVENTION

Figure 1:
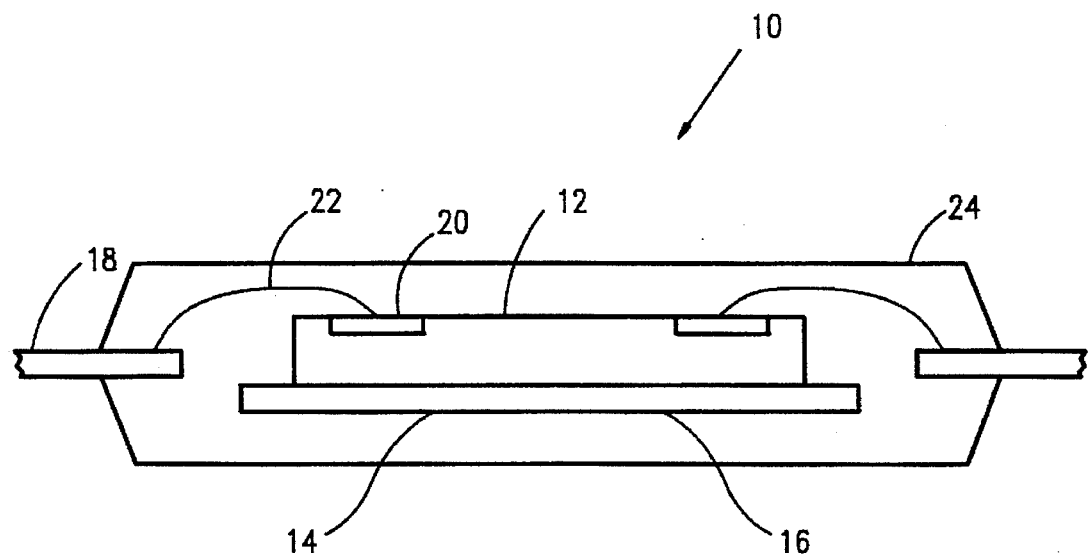
FIG. 1 is a diagrammatic cross-sectional elevational view of a prior art integrated circuit package assembly showing ESD protection integrally formed within a semiconductor chip.
Figure 2:
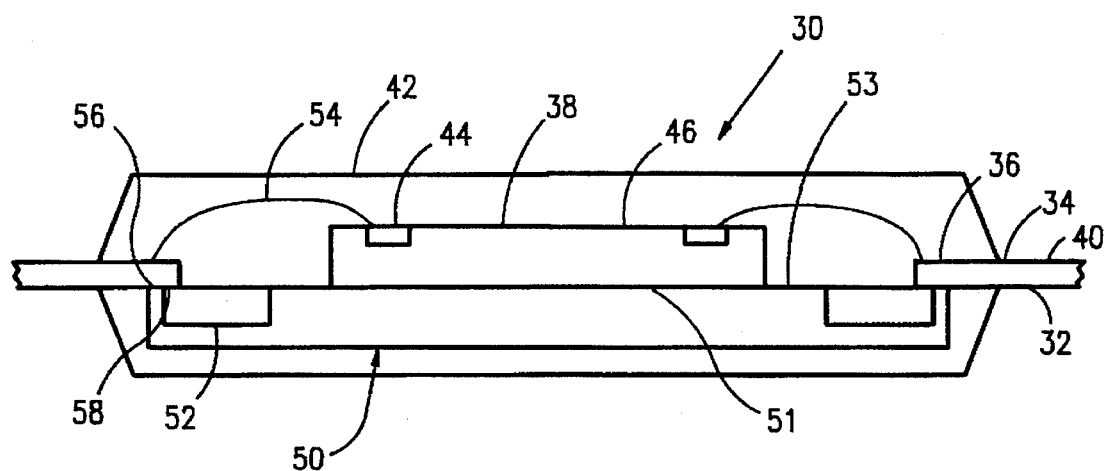
FIG. 2 is a diagrammatic cross-sectional elevational view of a first embodiment of an integrated circuit package assembly manufactured in accordance with the present invention and showing ESD protection provided in the form of an ESD Interposer on which a semiconductor chip is supported.

Having described FIG. 1 previously, attention is immediately directed to FIG. 2, which illustrates a first embodiment of an integrated circuit package assembly generally designated by the reference numeral 30 and designed in accordance with the present invention. IC package assembly 30 includes a lead frame 32 including a plurality of electrically conductive lead frame leads 34, but without a die attach pad. Each lead frame lead 34 includes a bonding portion 36 adjacent to a semiconductor chip 38 and an external portion 40 provided extending outwardly from an overall plastic or other such suitable encapsulant material 42. Semiconductor chip 38 includes a plurality of chip input/output terminals 44 positioned on an upper surface 46 of the chip.

Continuing to refer to FIG. 2 and in accordance with the present invention, an ESD interposer 50 supports semiconductor chip 38 within assembly 30 instead of the typical die attach pad illustrated in FIG. 1. Chip 38 may be attached to interposer 50 by any suitable material such as, for instance, a thermally conductive adhesive 51. Interposer 50 is typically formed from a semiconductor material such as, for example, a silicon substrate, although other materials may be utilized provided only that the material is amenable to integrated circuit fabrication techniques. Interposer 50 includes a plurality of ESD protection circuits 52 which are integrally formed with the substrate material of the interposer. Protection circuits 52 are arranged so as to be accessible for electrical contact on an upper surface 53 of the interposer in accordance with the design of the overall package based on factors such as the configuration of lead frame 32 and chip input/output terminals 44 on chip 38. It should be understood that ESD interposer 50 and its protection circuits 52 may be arranged in an unlimited number of ways (with respect to size, shape, number and or relative position on the substrate) within the scope of the present invention. For purposes of simplicity, the specific details of the structure of ESD protection circuits 52 are not illustrated and will not be described herein since such circuitry is well known in the art.

Still referring to FIG. 2, a plurality of bonding wires 54 are illustrated each of which connects a respective bonding portion 36 of one of lead frame leads 34 with a respective one of chip input/output terminals 44. Additionally, an appropriate portion 56 of each ESD protection circuit 52 is in electrical contact with a corresponding one of lead frame leads 34. Electrical contact as well as fixed mechanical contact between the two last-mentioned items may be ensured by an electrically conductive epoxy 58 or by other materials which are well known in the art such as, for example, solder. It should be mentioned that, in this first embodiment, lead frame leads 34 may overlap protection circuits 52 either partially, as shown, or completely provided only that electrical contact is maintained between the two in the appropriate manner, that is, so that ESD and other such surges are discharged through ESD protection means 52 without reaching chip 38. Alternatively, leads 34 may be electrically connected with protection circuits 52 by electrically conductive metal traces (not shown) wherein the traces are in electrical contact with leads 34 at one end and in electrical contact with protection circuits 52 at their opposing ends. While not shown, each ESD protection circuit 52 is provided with a connection to a circuit ground within the overall package assembly. These ground connections may be provided by bonding wires, by electrically conductive traces which are defined integrally with the substrate of ESD interposer 50 or by any other suitable technique within the art. As previously described, the respective ESD protection circuits 52 will actively clamp an overvoltage condition applied to one or more of lead frame leads 34 to a predetermined safe voltage level above circuit ground in a manner which is well known in the art whereby to protect the remaining sensitive circuitry of the chip from almost certain damage by shunting the excess energy to ground.

Having generally described the structure of the first embodiment of the integrated circuit package assembly of FIG. 2, a discussion of its advantages as compared with prior art assemblies such as the one depicted by FIG. 1 will now be provided. Essentially, the advantages of the present invention stem from the removal of the requirement for providing extensive on-chip ESD protection. For example, the size of the chip itself can be reduced while, at the same time, maintaining or even increasing the functionality of the chip once the space consuming ESD protection circuitry is located off of the chip. This advantage is maintained even in cases where it is desirable to retain minimal ESD protection on the chip.

Another advantage resides in the fact that the ESD interposer of the present invention is capable of providing levels of ESD protection which have heretofore not been seen in typical IC packages. Because the ESD interposer provides a plentiful supply of semiconductor material for use in forming ESD protection circuitry, the protection capacity of the ESD protection circuitry can be dramatically improved by simply increasing the size of the components which make up the protection circuitry. Still further improvements in protection may be had by the addition of other components which improve either capacity or which reduce response times in the event of an overvoltage condition caused by ESD, power surges or other such irregularities.

Still another advantage results in that the ESD interposer may be produced using a substrate material which is relatively inexpensive as compared with the material from which the complex semiconductor chip must be produced. This advantage is seen for at least two reasons. First, the geometries of the components which make up the integrally formed ESD protection circuitry in the interposer are relatively simple. Second, the ESD interposer will typically utilize much larger geometries than those used on the IC chip itself since space is plentiful and larger geometries improve ESD protection with no attendant increase in manufacturing costs. Moreover, manufacturing costs associated with producing the interposer will be low because of the relatively coarse geometries of its integral components and the need for only a few processing steps in the formation of the protection circuitry components.

Figure 3:
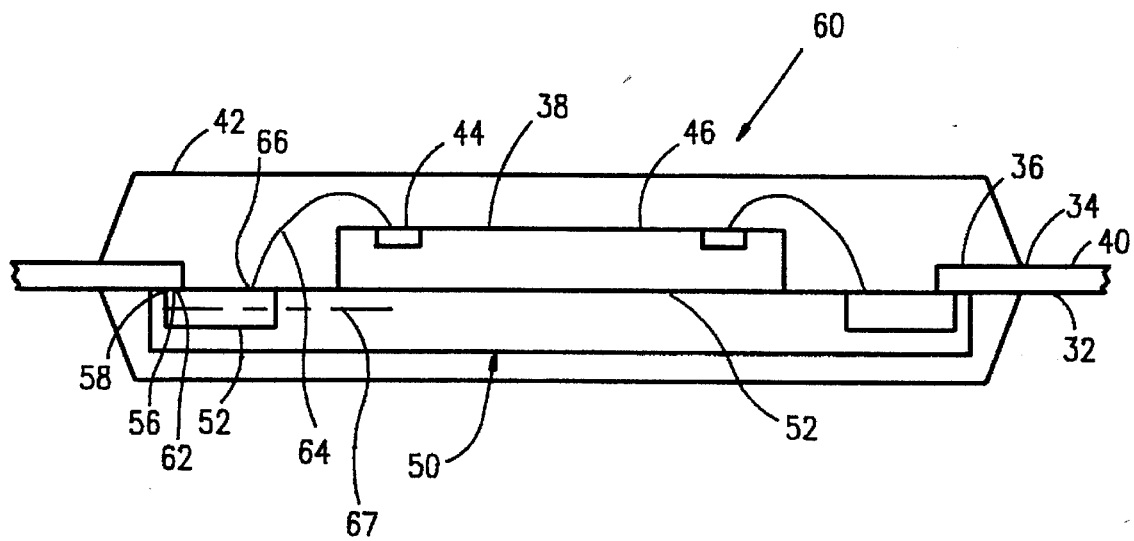
FIG. 3 is a diagrammatic cross-sectional elevational view of an integrated circuit package assembly similar to the one shown in FIG. 2 except that the bonding wires which form part of the assembly are arranged in a way which causes them to be shorter than those in the assembly of FIG. 1.

Attention is now directed to FIG. 3 which illustrates another integrated circuit package assembly generally designated by reference numeral 60 and designed in accordance with the present invention. Assembly 60 is similar to assembly 30 of FIG. 2. Therefore, like reference numerals have been applied wherever possible. For purposes of brevity, the description of identical components will not be repeated. It is to be understood, however, that assembly 60 provides all the previously described advantages of assembly 30 as well as an additional advantage which will be described at an appropriate point following a description of the structural modifications of assembly 60 over assembly 30.

Continuing to refer to FIG. 3, bonding portion 36 of each lead frame lead 34 and portion 56 of ESD protection circuitry 52 are arranged such that portion 56 comprises an outer contact area 62 of the ESD protection circuit which is in electrical contact with bonding portion 36 of each respective lead frame lead 34. In this example, the lead frame lead may only cover outer contact area 62. A plurality of bonding wires 64 electrically connects respective inner contact portions 66 of ESD protection circuits 52 with respective ones of chip input/output terminals 44. ESD protection circuit 52 is elongated along an axis 65 which extends between the leadframe lead and the chip input/output terminal with which the chip input/output terminal is in electrical communication. It is readily apparent that the configuration of IC package assembly 60 substantially reduces the length of bonding wires 64 as compared with the more typical bonding wire arrangement of FIG. 1 wherein bonding wires 22 extend from the lead frame leads directly to the semiconductor chip. Thus, as previously described, high manufacturing costs and reliability problems resulting from the use of expensive gold bonding wires and from wire sweep are substantially alleviated by the present invention. In fact, for most applications, it may be desirable to configure ESD protection circuits 52 in a way which extends them as closely as possible to the IC chip so as to reduce the length of the bonding wires to an absolute minimum.

Figure 4:
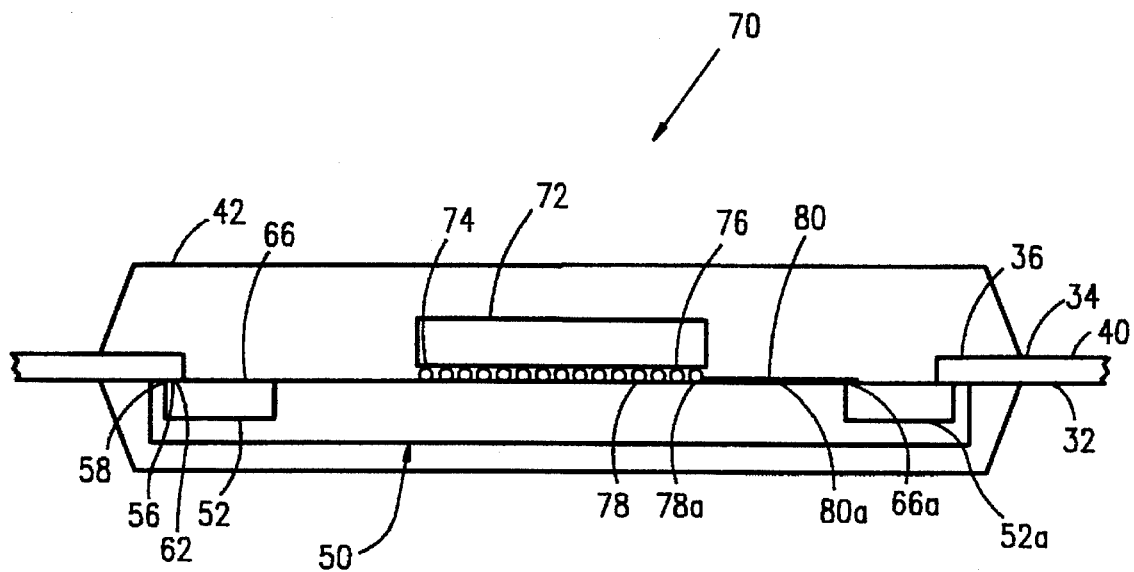
FIG. 4 is a diagrammatic cross-sectional elevational view of a second embodiment of an integrated circuit package assembly manufactured in accordance with the present invention and showing ESD protection provided in the form of an ESD Interposer on which a semiconductor chip is supported.

Turning now to FIG. 4, a second embodiment of an integrated circuit package assembly is illustrated which is generally designated by the reference numeral 70 and is designed in accordance with the present invention. Once again, reference numbers of items of assembly 70 utilized in previous illustrations have been applied in the present figure wherever possible and the reader is referred to the preceding descriptions of these items. Assembly 70 includes a semiconductor chip 72 having an array of chip input/output terminals 74 arranged on a lower surface 76 of the chip, i.e., arranged in a Flip-Chip manner. An array of solder balls 78 is applied to the array of chip input/output terminals such that one solder ball is positioned on each respective chip input/output terminal 74.

Continuing to refer to FIG. 4 and in accordance with the present invention, ESD interposer 50 is integrally formed whereby to define an array of electrically conductive traces 80 (only one of which is shown for purposes of simplicity). In the present example, trace 80a extends from a solder ball 78a beneath chip 72 to an inner contact portion 66a of a respective ESD protection circuit 52a. While not shown, all of the solder balls are connected to the leads through cooperating traces in the manner illustrated by trace 80a. It should also be understood that chip 72 may be replaced by another chip or assembly (neither of which is shown) which includes its input/output terminals on an upper surface with the solder balls arranged on a lower surface. The solder balls and the chip input/output terminals are then electrically interconnected by vias extending therebetween. Assembly 70 provides the aforementioned advantages of reduced chip size accompanied by the ability to improve functionality and greatly enhanced ESD protection using an economically produced ESD interposer in the flip-chip arrangement illustrated or other similar arrangements.

It should be understood that a integrated circuit package assembly incorporating the ESD interposer of the present invention may be embodied in many other specific forms and produced by other methods without departing from the spirit or scope of the present invention. Therefore, the present examples are to be considered as illustrative and not restrictive, and the invention is not to be limited to the details given herein, but may be modified within the scope of the appended claims.

What is claimed is:

1. An integrated circuit package assembly comprising:
   a) a semiconductor chip including a plurality of chip input/output terminals;
   b) a substrate supporting said chip; and
   c) an arrangement including a plurality of ESD protection means on said substrate for providing ESD protection to predetermined ones of said chip input/output terminals.

2. An integrated circuit package assembly in accordance with claim 1 wherein said substrate is formed from a semiconductor material.

3. An integrated circuit package assembly in accordance with claim 2 wherein said semiconductor material is silicon.

4. An integrated circuit package assembly in accordance with claim 2 wherein said plurality of ESD protection means is integrally formed with said semiconductor material.

5. An integrated circuit package assembly in accordance with claim 1 wherein said arrangement includes means for electrically connecting each of said predetermined chip input/output terminals with respective ones of said ESD protection means and for providing electrical communication between each of said predetermined chip input/output terminals and components external to said integrated circuit package assembly such that said at least one ESD protection means is electrically interposed between that chip input/output terminal and any external component with which the terminal is in electrical communication in a way which protects the chip from ESD.

6. An integrated circuit package assembly in accordance with claim 5 wherein said electrical connecting means includes a plurality of bonding wires which electrically interconnect each of said predetermined chip input/output terminals with respective ones of said ESD protection means.

7. An integrated circuit package assembly in accordance with claim 1 wherein said arrangement includes (i) a plurality of output leads connected with respective ones of said ESD protection means and designed for electrical connection with external components and (ii) means for electrically connecting said output leads and said ESD protection means to respective ones of the input/output terminals of said chip such that at least one ESD protection means is electrically interposed between an input/output terminal of said chip and a respective output lead in a way which protects said chip from electrostatic discharge.

8. An integrated circuit package assembly in accordance with claim 7 wherein said connecting means includes a plurality of bonding wires, each of which is directly connected at one end to a respective one of said input/output terminals and at its opposite end directly to a respective one of said output leads.

9. An integrated circuit package assembly in accordance with claim 7 wherein said connecting means includes a plurality of bonding wires, each of which is directly connected at one end to a respective one of said input/output terminals and at its opposite end directly to a respective one of said ESD protection means.

10. An integrated circuit package assembly in accordance with claim 9 wherein each ESD protection means is elongated in configuration and extends along its elongation axis on said substrate between a respective one of said input/output terminals and a corresponding respective output lead such that one of each ESD protection means is closer to its respective input/output terminal than its other end, and wherein the opposite end of each of said bonding wires is connected to its respective ESD protection means at its one, closer end, whereby to minimize the length of the bonding wires.

11. An integrated circuit package assembly in accordance with claim 1 wherein all of the ESD protection for the assembly is provided by said arrangement.

12. An integrated circuit package assembly in accordance with claim 1 wherein said chip includes integral ESD protection.

13. An integrated circuit package assembly in accordance with claim 1 wherein said arrangement provides more than 2000 volts of ESD protection.

14. An integrated circuit package assembly in accordance with claim 1 wherein said arrangement provides 4,000 volts of ESD protection.

15. An integrated circuit package assembly in accordance with claim 1 wherein said substrate includes means for electrically connecting each of said predetermined chip input/output terminals with respective ones of said ESD protection means and wherein said arrangement includes means for providing electrical communication between each of said ESD protection means and components external to said integrated circuit package assembly such that at least one of said ESD protection means is electrically interposed between each predetermined chip input/output terminal and any external component with which the terminal is in electrical communication in a way which protects the chip from ESD.

16. An integrated circuit package assembly in accordance with claim 14 wherein said electrical connecting means includes a plurality of electrically conductive traces integrally formed with said substrate, each respective one of said traces in electrical contact with a respective predetermined chip input/output terminal and with a respective one of said ESD protection means.

17. An integrated circuit package assembly in accordance with claim 15 wherein said chip includes a surface on which said chip input/input output terminals are arranged in an array and wherein said chip is supported by said surface on said substrate such that each chip input/output terminal contacts a respective one of said traces.

18. An integrated circuit package assembly in accordance with claim 17 wherein electrical contact between each respective chip input/output terminal and each respective trace is accomplished using a solder ball.

19. An integrated circuit package assembly comprising:
 a) a semiconductor chip including a plurality of chip input/output terminals;
 b) a semiconductor substrate supporting said semiconductor chip and including a plurality of ESD protection means formed integrally with said semiconductor substrate for providing ESD protection to predetermined ones of said chip input/output terminals;
 c) a plurality of output leads connected with respective ones of said ESD protection means and designed for electrical connection with external components; and
 d) means including a plurality of bonding wires for electrically connecting said output leads and said ESD protection means to respective ones of the input/output terminals of said chip such that at least one ESD protection means is electrically interposed between an input/output terminal of said chip and a respective output lead in a way which protects said chip from electrostatic discharge.

* * * * *